(12) United States Patent
Liu et al.

(10) Patent No.: US 7,246,735 B2
(45) Date of Patent: Jul. 24, 2007

(54) WIRE CLAMPING PLATE

(75) Inventors: Deming Liu, Kwai Chung (CN); Ran Fu, Kwai Chung (CN)

(73) Assignee: ASM Assembly Automation Ltd., Hong Kong (CN)

( * ) Notice: Subject to any disclaimer, the term of this patent is extended or adjusted under 35 U.S.C. 154(b) by 396 days.

(21) Appl. No.: 11/031,412

(22) Filed: Jan. 7, 2005

(65) Prior Publication Data

US 2006/0151571 A1 Jul. 13, 2006

(51) Int. Cl.
*B23K 37/00* (2006.01)

(52) U.S. Cl. ...................................... 228/44.7; 228/4.5

(58) Field of Classification Search ............... 228/44.7, 228/4.5, 49.5
See application file for complete search history.

(56) References Cited

U.S. PATENT DOCUMENTS

| | | | |
|---|---|---|---|
| 4,866,005 A | 9/1989 | Davis et al. | 437/100 |
| 6,706,114 B2 | 3/2004 | Mueller | 117/84 |
| 2005/0143251 A1* | 6/2005 | Mehrotra et al. | 501/95.3 |

FOREIGN PATENT DOCUMENTS

JP 02-1674-5 A * 1/1990

* cited by examiner

*Primary Examiner*—Jonathan Johnson
(74) *Attorney, Agent, or Firm*—Ostrolenk, Faber, Gerb & Soffen, LLP

(57) ABSTRACT

A wire clamping plate is provided for a wire clamp that is adapted to contact a length of metallic wire when the wire clamp is applying a clamping force on the wire. The wire clamping plate comprises doped silicon carbide, which makes it electrically conductive and exhibit a high level of wear resistance.

8 Claims, 1 Drawing Sheet

WIRE CLAMPING PLATE

FIELD OF THE INVENTION

The invention relates to a wire clamp, and in particular to the wire clamping plates of a wire clamp, which is used for gripping and controlling metallic bonding wire during wire bonding operations.

BACKGROUND AND PRIOR ART

Wire bonding and bumping are important steps in electronic packaging. Wire bonding involves the connection of conductive wires between different electronic components of a semiconductor device, usually a semiconductor chip and a carrier or substrate, such as a lead frame. Bumping involves the placement of solder balls on a wafer or semiconductor chip, to enable electrical connections to be made between the chip and another electronic component.

To plant a bump or bond a wire onto a metallic connection pad either on a chip or a chip-mounting substrate by using a wire bonder, an effective bond or connection may be made between a bonding wire (which is typically made of gold, aluminum or copper) and the connection pad from the combined effect of bond force and temperature for a certain duration. One method of performing bonding is to use a capillary tip to feed bonding wire to the metallic contact pad, and to induce flexural agitation of the capillary tip driven by an ultrasonic transducer to apply a bonding force onto the bonding wire and contact pad.

Typically, a pair of wire clamping plates is equipped in a wire clamp of a wire bonding machine. FIG. 1 is an isometric view of a wire clamp 10 utilized in a wire bonding machine comprising wire clamping plates. The wire clamp 10 generally comprises a movable jaw 12 and a fixed jaw 14. Clamping of a length of metallic bonding wire extended between the movable jaw 12 and fixed jaw 14 is achieved by using a motor to control opening and closing of the movable jaw 12. A clamping plate 16 is located and bonded by conductive epoxy on each of the movable jaw 12 and fixed jaw 14. When the movable jaw 12 is closed, the clamping plates 16 grip the bonding wire. Accordingly, the clamping plates 16 of the movable jaw 12 and fixed jaw 14 form the surfaces that contact and clamp the bonding wire when the wire clamp 10 is applying a clamping force on the bonding wire.

The main function of the wire clamp is to feed the wire to the capillary tip, clamp the wire after the wire is extended and a wire bond is made, and then to drag the wire to break it from a second bond after the second bond has been made. The friction created between the wire and the clamping plates, especially due to the force arising from clamping and pulling the wire for breaking the wire, causes wearing-out at the surfaces of the clamping plates. This wearing-out at the surfaces of the clamping plates affects the wire looping consistency and other related performances. Wear resistance is thus required of the material comprised in the clamping plates.

Also, when making a ball bond during the wire-bonding process, an electrical spark called EFO (electrical flaming-off) is created. The purpose of EFO is to melt a tail of the wire into a free air ball. A large current pulse is produced in the EFO firing process to create the spark, and may generate micro-arcing if the electric conductivity of the wire clamping plates is not large enough so that an instant potential could be generated on the plate to counteract the pulse voltage due to the EFO firing. Any electrical discharging at the plate would further accelerate the wearing-out of the clamping plates.

For the above reasons, a material used for the wire clamping plate should desirably be of high wear resistance and electrically conductive.

Hard alloys, such as cemented carbide, are widely used as a primary material to make wire clamping plates. Hard alloys basically consist of a hard phase (for example, tungsten carbide, titanium carbide and niobium carbide) bonded by a soft phase (for example, nickel or cobalt). Such alloy materials are electrically conductive and exhibit considerably high wear resistance. Even so, when these alloys are used in wire clamping plates, wear marks on the clamping plates can be observed after a certain number of wire bonding cycles. It has been observed that wear usually starts from the alloys' soft binder phase, at or adjacent to the interphase boundaries between the hard phase and soft binder phase. As a result, the binder around a hard carbide grain is gradually worn off and the grain in particular becomes loosely bonded with the rest of binder around it. In this condition, the grain is susceptible to detachment from the bonded matrix. As the wire bonding cycles continue and greater wearing ensues, a wire mark is seen. When the bonding wire is gold wire and the binder is cobalt, the situation is even worse because gold wire tends to stick to cobalt, causing even faster wearing out of the clamping plates.

It is thus widely accepted that a key disadvantage of using cemented carbides for wire clamping plates is the existence of the aforesaid soft binder phase. Nonetheless, it is not easy to avoid the binder phase because it is used to enhance the material integrity, in particular its strength. Moreover, it is difficult to manufacture binderless carbides free of porosity. Porosity also deteriorates the wear resistance of the wire clamping plate.

Due to the above disadvantages of cemented carbides, it is proposed that single phase hard ceramics like alumina or silicon carbide be utilized instead. Since there is no binder phase (such as cobalt, nickel or others), the wearing-off of the material should be much reduced, and the reliability would correspondingly be improved significantly. At the same time, the single phase materials would have to present some conductivity that is required for ball bonding applications.

SUMMARY OF THE INVENTION

It is therefore an object of the invention to seek to provide a material for manufacturing wire clamping plates for wire clamps that exhibits electrical conductivity and a high level of wear resistance.

Accordingly, the invention provides a wire clamping plate for a wire clamp that is adapted to contact a length of metallic wire when the wire clamp is applying a clamping force on the wire, wherein the wire clamping plate comprises doped silicon carbide.

It will be convenient to hereinafter describe the invention in greater detail by reference to the accompanying drawing. The particularity of the drawing and the related description is not to be understood as superseding the generality of the broad identification of the invention as defined by the claims.

DETAILED DESCRIPTION OF THE PREFERRED EMBODIMENT

Figure 1:
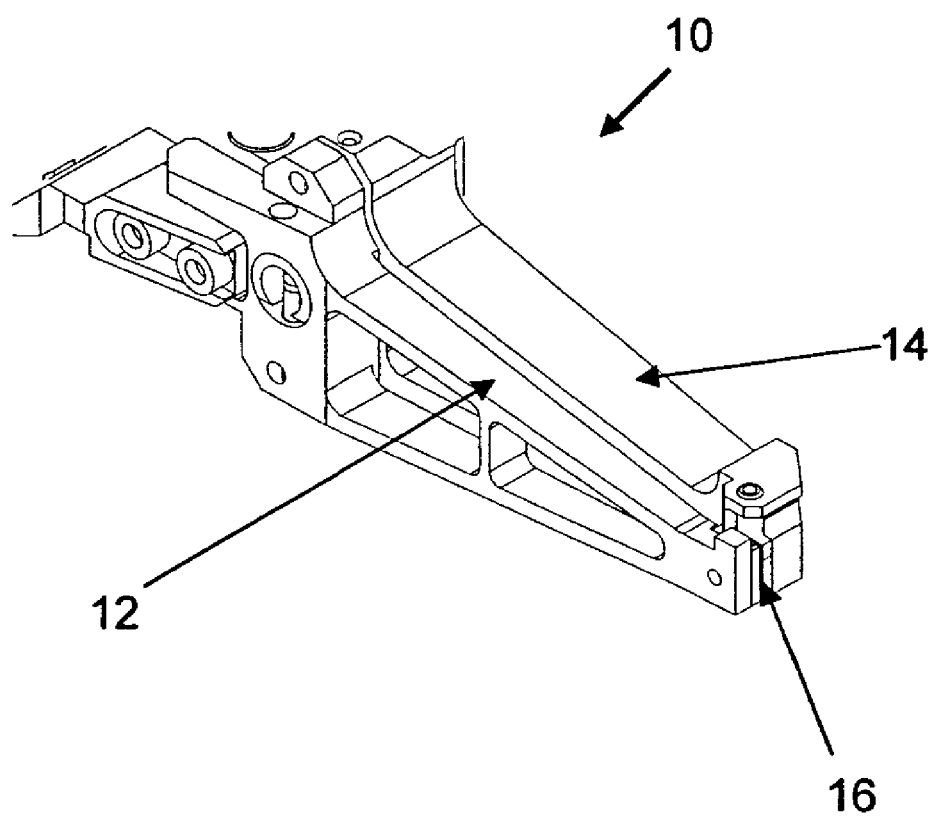
FIG. 1 is an isometric view of a wire clamp utilized in a wire bonding machine comprising wire clamping plates.

An example of a material that is suitable for manufacturing a wire clamping plate according to the preferred embodiment of the invention will now be described. Based on the aforementioned considerations, it is proposed that a single phase, hard and electrically conductive material be used for making the wire clamping plates. In this respect, the material used according to the preferred embodiment of the invention is a doped silicon carbide (SiC) material. The silicon carbide material may be in single crystal or poly-crystal form.

Generally, a commercially-available SiC crystal may be utilized. SiC is one of the hardest commercially-available materials with a Mohr's hardness index of 9, just next to that of diamond (10). The SiC is doped with a doping element or dopant, preferably aluminum (Al) (p-type semiconductor) or nitrogen (N) (n-type semiconductor), so that it can conduct electricity with introduced charge carriers, namely free electrons or holes.

Single crystal SiC production is typically conducted by sublimation physical vapor transport ("PVT") growth, as is widely practiced in the art. Examples of processes for performing sublimation are found in U.S. Pat. No. 4,866,005 for "Sublimation of Silicon Carbide to Produce Large, Device Quality Single Crystals of Silicon Carbide", and U.S. Pat. No. 6,706,114 for "Method of Fabricating Silicon Carbide Crystals", which are incorporated herein by reference.

The electrical character of SiC is tailored by adding dopants, impurity elements that affect its electrical properties. A dopant makes the SiC material electrically active by providing free electrons (donors) or electron holes (acceptors) when it substitutes native atoms at lattice sites. Dopants can be introduced into the SiC during the growth of the SiC crystals, or when processing a fabricated SiC wafer with ion implantation or deposition, and followed by thermal diffusion to create the impurity composition over a desired depth into the wafer. The conductivity of the doped wafer is a function of the impurity type, concentration and activation percentage. Typically, nitrogen (for n-type) or aluminum (for p-type) are introduced. Other than Al and N, boron (B) (p-type semiconductor) and phosphorus (P) (n-type semiconductor) were also found to be suitable doping elements. The doping process for these other elements may also be carried out substantially according to the process as described above. As various processes for the formation of doped SiC are well-known in the art, they will not be further elaborated upon herein.

A primary benefit of utilizing the said material is that doped SiC wafers are commercially available. The wire clamping plates may thus comprise slices of material that are cut from a semiconductor wafer. Suitable wafers that have been found appropriate include 4HN Silicon Carbide Wafers and 6HN Silicon Carbide Wafers manufactured by Cree, Inc.

Therefore, a maker of wire clamps need not have in-house expertise or equipment to manufacture doped SiC wafers in order to implement the wire clamping plates according to the preferred embodiment of the invention. Commercially-available wafers may be purchased on the market, cut into suitable sizes and stuck onto contacted surfaces of wire clamp jaws using electrically-conductive adhesive. A suitable conductive adhesive for this purpose is a silver-filled electrically conductive adhesive, such as Loctite® 3880, but it should be appreciated that other adhesives may also be appropriate.

It was found that a single-crystal SiC doped with Al or N exhibits an electrical resistivity that is as low as 0.065 ohm-cm, and therefore conductivity is more than adequate for the purpose of avoiding arcing between the clamping plates and the wire. Furthermore, the material is extremely wear resistant. Since there are no phase or grain boundaries, microscale wear resistance is realized. Also, a high quality surface finish with a high level of flatness is attainable owing to the wafer fabrication technology used. Since single crystalline silicon wafers of sizes as large as 80 mm are readily available in the market while a single piece of the wire clamping plate is only several millimeters in diameter, a high production yield is thereby possible in order to produce dozens of wire clamping plates from a single semiconductor wafer.

The invention described herein is susceptible to variations, modifications and/or additions other than those specifically described and it is to be understood that the invention includes all such variations, modifications and/or additions which fall within the spirit and scope of the above description.

The invention claimed is:

1. A wire clamping plate for a wire clamp that is adapted to contact a length of metallic wire when the wire clamp is applying a clamping force on the wire, wherein the wire clamping plate comprises doped silicon carbide.

2. A wire clamping plate according to claim 1, wherein the silicon carbide is in single crystal form.

3. A wire clamping plate according to claim 1, wherein the silicon carbide is in poly-crystal form.

4. A wire clamping plate according to claim 1, wherein the silicon carbide is doped by a dopant selected from the group consisting of: nitrogen, aluminum, boron and phosphorous.

5. A wire clamping plate according to claim 1, wherein the wire clamping plate comprises a slice of material that is cut from a semiconductor wafer.

6. A wire clamping plate according to claim 1, wherein the wire clamping plate is attached to the wire clamp using a conductive adhesive.

7. A wire clamping plate according to claim 6, wherein the conductive adhesive comprises a silver-filled electrically conductive epoxy.

8. A wire clamp having a wire clamping plate comprising doped silicon carbide that is adapted to contact a length of metallic wire when the wire clamp is applying a clamping force on the wire.

* * * * *